(12) United States Patent
Polomoff et al.

(10) Patent No.: US 12,204,144 B2
(45) Date of Patent: Jan. 21, 2025

(54) BRAGG REFLECTOR FOR PHOTONIC CHIP SECURITY STRUCTURE

(71) Applicant: GLOBALFOUNDRIES U.S. Inc., Malta, NY (US)

(72) Inventors: Nicholas A. Polomoff, Irvine, CA (US); Yusheng Bian, Ballston Lake, NY (US); Vibhor Jain, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 71 days.

(21) Appl. No.: 17/525,327

(22) Filed: Nov. 12, 2021

(65) Prior Publication Data

US 2023/0152501 A1    May 18, 2023

(51) Int. Cl.
| | | |
|---|---|---|
| *G01N 27/04* | (2006.01) | |
| *G02B 6/12* | (2006.01) | |
| *G02B 6/122* | (2006.01) | |
| *H01L 23/00* | (2006.01) | |

(52) U.S. Cl.
CPC .......... *G02B 6/122* (2013.01); *G01N 27/041* (2013.01); *H01L 23/573* (2013.01); *G02B 2006/12061* (2013.01); *G02B 2006/12104* (2013.01); *Y10T 428/24802* (2015.01)

(58) Field of Classification Search
CPC .......... G02B 6/122; G02B 2006/12061; G02B 2006/12104
See application file for complete search history.

(56) References Cited

U.S. PATENT DOCUMENTS

| | | |
|---|---|---|
| 5,321,779 A | 6/1994 | Kissa |
| 6,298,178 B1 | 10/2001 | Day et al. |
| 6,496,022 B1 | 12/2002 | Kash et al. |
| 6,611,636 B2 | 8/2003 | Delivala |
| 6,748,125 B2 | 6/2004 | Delivala |
| 6,839,488 B2 | 1/2005 | Gunn, III |
| 7,115,912 B2 | 10/2006 | Kash et al. |
| 7,260,293 B1 | 8/2007 | Gunn, III et al. |
| 7,295,455 B2 | 11/2007 | Okuda |
| 7,373,030 B2 | 5/2008 | Gao et al. |
| 7,884,625 B2 | 2/2011 | Bartley et al. |
| 8,089,285 B2 | 1/2012 | Hsu et al. |
| 8,110,894 B2 | 2/2012 | Savry et al. |
| 8,198,641 B2 | 6/2012 | Zachariasse |
| 8,664,047 B2 | 3/2014 | Lower et al. |

(Continued)

FOREIGN PATENT DOCUMENTS

| | | |
|---|---|---|
| CN | 106206726 A | 12/2016 |
| WO | 2020087025 | 4/2020 |

OTHER PUBLICATIONS

Response to Office Action dated Mar. 22, 2022 in related U.S. Appl. No. 17/070,377, 8 pages.

(Continued)

*Primary Examiner* — Gerard Higgins
(74) *Attorney, Agent, or Firm* — Anthony Canale; Andrew M. Calderon; Calderon Safran & Wright P.C.

(57) ABSTRACT

The present disclosure relates to semiconductor structures and, more particularly, to a photonic chip security structure and methods of manufacture. The structure includes an optical component over a substrate material, and at least one vertical wall including a reflecting material within a dielectric stack of material and surrounding the optical component.

20 Claims, 17 Drawing Sheets

(56) References Cited

U.S. PATENT DOCUMENTS

| | | |
|---|---|---|
| 8,742,830 B2 | 6/2014 | Luo et al. |
| 8,809,858 B2 | 8/2014 | Lisart et al. |
| 8,938,627 B2 | 1/2015 | Oggioni et al. |
| 8,946,859 B2 | 2/2015 | Lisart et al. |
| 9,075,251 B2 | 7/2015 | Dwivedi et al. |
| 9,117,833 B2 | 8/2015 | Mougin et al. |
| 9,306,573 B2 | 4/2016 | McCollum |
| 9,455,233 B1 | 9/2016 | Bhooshan et al. |
| 9,565,021 B1 | 2/2017 | Czaplewski et al. |
| 9,741,670 B2 | 8/2017 | Charbonnier et al. |
| 9,953,727 B1 | 4/2018 | Fifield et al. |
| 9,965,652 B2 | 5/2018 | Joharapurkar et al. |
| 11,121,097 B1 | 9/2021 | Jain et al. |
| 11,171,095 B1 | 11/2021 | Jain et al. |
| 2001/0033012 A1 | 10/2001 | Kommerling et al. |
| 2003/0091303 A1 | 5/2003 | Kami et al. |
| 2005/0105842 A1 | 5/2005 | Vonsovici et al. |
| 2005/0141843 A1 | 6/2005 | Warden et al. |
| 2008/0044130 A1 | 2/2008 | Pitwon |
| 2010/0026313 A1 | 2/2010 | Bartley et al. |
| 2010/0059822 A1 | 3/2010 | Pinguet et al. |
| 2010/0327385 A1 | 12/2010 | Shiba et al. |
| 2011/0006284 A1 | 1/2011 | Cho et al. |
| 2011/0193221 A1 | 8/2011 | Hu et al. |
| 2014/0035136 A1 | 2/2014 | Buer et al. |
| 2014/0353849 A1 | 12/2014 | Arora et al. |
| 2015/0192735 A1 | 7/2015 | Ellis-Monaghan et al. |
| 2015/0214163 A1 | 7/2015 | Kuenemund et al. |
| 2015/0219850 A1 | 8/2015 | Fish et al. |
| 2016/0307855 A1 | 10/2016 | Charbonnier et al. |
| 2017/0168234 A1 | 6/2017 | Shi et al. |
| 2018/0075921 A1 | 3/2018 | Fifield et al. |
| 2018/0219112 A1 | 8/2018 | Norberg et al. |
| 2019/0025504 A1 | 1/2019 | Tsujita et al. |
| 2019/0027535 A1 | 1/2019 | Kumar et al. |
| 2020/0076622 A1 | 3/2020 | Best |
| 2020/0125716 A1 | 4/2020 | Chittamuru et al. |
| 2020/0251602 A1 | 8/2020 | Shen et al. |
| 2020/0328162 A1 | 10/2020 | Haba et al. |
| 2021/0082532 A1 | 3/2021 | Hunt-Schroeder et al. |
| 2021/0084800 A1 | 3/2021 | Yan et al. |
| 2021/0109283 A1 | 4/2021 | Meagher et al. |
| 2021/0242651 A1 | 8/2021 | Dudley et al. |

OTHER PUBLICATIONS

Office Action dated Dec. 27, 2021 in related U.S. Appl. No. 17/070,377, 12 pages.
Notice of Allowance dated Jun. 1, 2022 in related U.S. Appl. No. 17/070,377, 5 pages.
Bashir et al., "SecONet: a Security Framework for a Photonic Network-on-Chip", IEEE, 2020, 8 pages.
Zhukovsky et al., "Bragg reflection waveguides as integrated sources of entangled photon pairs", Optical Society of America, vol. 29, No. 9, Sep. 2012, 8 pages.
Shen et al., "Nanopyramid: an Optical Scrambler Against Backside Probing Attacks", Florida Institute for Cyber Security (FICS) Research ECE Department, University of Florida, 10 pages.
Giewont et al., "300mm Monolithic Silicon Photonics Foundry Technology", IEEE Journal of Selected Topics in Quantum Electronics, vol. 25, No. 5, Sep./Oct. 2019, 11 pages.
Rakowski et al., "45nm CMOS—Silicon Photonics Monolithic Technology (45CLO) for next-generation, low power and high speed optical interconnects", IEEE, Downloaded on Nov. 15, 2020, 3 pages.
Bian et al., "Towards low-loss monolithic silicon and nitride photonic building blocks in state-of-the-art 300mm CMOS found", Frontiers in Optics/Laser Science © OSA 2020, 2 pages.
Bian et al., "Monolithically integrated silicon nitride platform", OFC 2021 © OSA 2021, 3 pages.
Boyer et al., "Evaluation of the Near-Field Injection Method at Integrated Circuit Level", Freescale Semiconductor, Inc., Toulouse 31023, France, Sep. 2014, 8 pages.
Manich et al., "Detection of Probing Attempts in Secure ICs", 2012 IEEE International Symposium on Hardware-Oriented Security and Trust, 6 pages.
Kumar, "A hollow waveguide Bragg reflector: a tunable platform for integrated photonics", Optics & Laser Technology, vol. 65, Abstract 2 pages.
Li et al., "Direct visualization of phase-matched efficient second harmonic and broadband sum frequency generation in hybrid plasmonic nanostructures", Official journal of the CIOMP 2047-7538, 2020, 10 pages.
Reshef et al., "Direct Observation of Phase-Free Propagation in a Silicon Waveguide", ACS Publications, Jul. 13, 2017, 16 pages.
Sterling, "New Security Risks Create Need For Stealthy Chips", Semiconductor Engineering, Oct. 3, 2019, 6 pages.
Vashistha et al., "Is Backside the New Backdoor in Modern SoCs?", International Test Conference, IEEE, 2019, 10 pages.
Cowen, "Hacking the unhackable", SPIE, Nov. 1, 2020, 8 pages.
Gomez, "How to Hack an Optical Fiber in Minutes . . . and How You Can Secure It", CIENA, Nov. 17, 2016, 3 pages.
Office Action dated Nov. 22, 2022 in related U.S. Appl. No. 17/525,293, 10 pages.
Office Action in U.S. Appl. No. 17/223,596 dated Dec. 12, 2023, 15 pages.
Foreign Office Action in CN Application No. 202110494954.2 dated Aug. 17, 2024; 18 pages.

BRAGG REFLECTOR FOR PHOTONIC CHIP SECURITY STRUCTURE

BACKGROUND

The present disclosure relates to semiconductor structures and, more particularly, to reflecting material which surrounds a photonics component and methods of manufacture.

Photonic semiconductors have many applications in modern consumer electronics. For example, photonic semiconductors include optical modulators, quantum well (QW) lasers, photodiodes, and waveguide structures, etc. Silicon waveguides are of special interest as they have unique guiding properties. For example, due to their unique guiding properties, silicon waveguides can be used for communications, interconnects, and biosensors.

Silicon photonic devices can be made using existing semiconductor fabrication techniques, and because silicon is already used as the substrate for most integrated circuits, it is possible to create hybrid devices in which the optical and electronic components are integrated onto a single microchip. However, unlike electronic devices which have known protection techniques, the silicon photonic devices remain vulnerable to both physical and non-invasive attacks aimed at obtaining cryptographic encryption keys, certificates, intellectual property and other critical or sensitive data.

SUMMARY

In an aspect of the disclosure, a structure includes an optical component over a substrate material, and at least one vertical wall including a reflecting material within a dielectric stack of material and surrounding the optical component.

In an aspect of the disclosure, a structure includes a silicon-on-insulator (SOI) substrate which includes a semiconductor layer on an insulator layer on a handle substrate, an optical component over the semiconductor on the insulator substrate, a dielectric stack of material covering the optical component, and a vertical wall within the dielectric stack of material and surrounding the optical component.

In an aspect of the disclosure, a method includes detecting a resistance of a Bragg reflector of a photonic chip security structure; comparing the detected resistance of the Bragg reflector with a predetermined acceptable limit; and generating a tamper signal in response to the detected resistance of the Bragg reflector being outside the predetermined acceptable limit.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
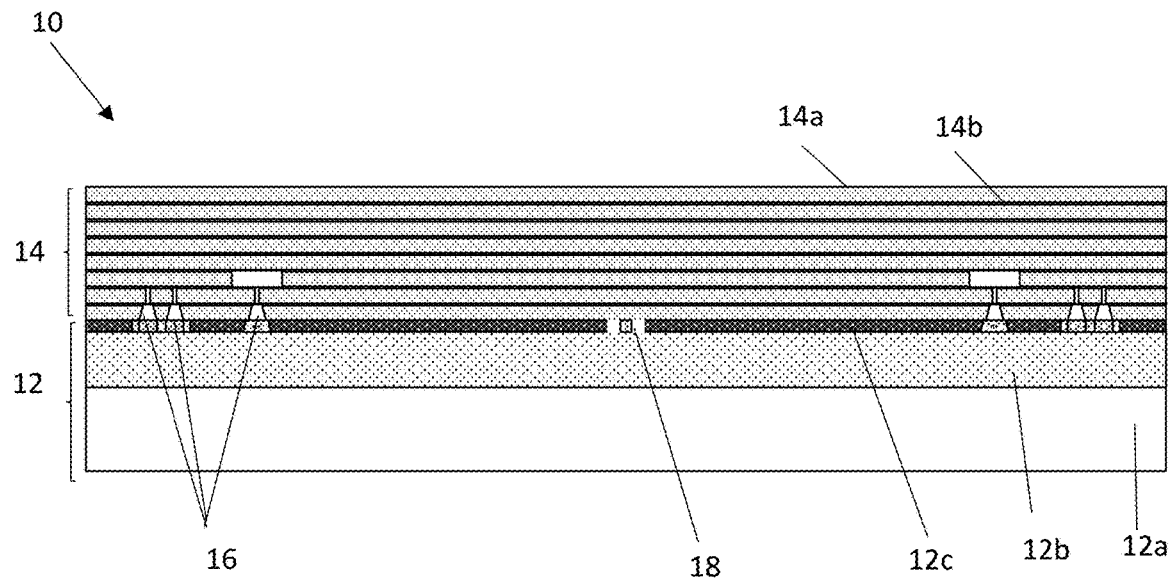
FIG. 1 shows an optical component, amongst other features, and respective fabrication processes in accordance with aspects of the present disclosure.

The present disclosure relates to semiconductor structures and, more particularly, to a Bragg reflector for photonic chip security and methods of manufacture. In embodiments, the photonic chip security structure includes a semiconductor material composed of reflecting material which surrounds a photonics component. In embodiments, the reflecting material may include a Bragg reflector. The reflecting material may include one or more vertical walls in combination with one or more lateral walls to provide an enclosure surrounding the photonics component. In particular, the term surrounding may be interpreted as walls on sides of the photonics component, on sides and over the photonics component or a complete enclosure about the photonics component. As to the latter example, the enclosure may include sidewalls, a top wall, and a bottom wall. Advantageously, the reflecting material may reflect optical hacking signals (e.g., incoming radiation) away from the photonics component to provide security for sensitive optical parts without impacting optical performance and functionality of the photonics component.

More specifically, the semiconductor reflecting material may form a Bragg reflector including vertical walls and lateral walls that surround an optical component, e.g., optical photonic waveguides or other critical optical components. The semiconductor reflecting material (e.g., vertical Bragg reflector) may surround the optical component on both sides and above the optical component in order to reflect or block incoming radiation (e.g., to absorb or reflect/deflect any optical hacking signal). In embodiments, the semiconductor reflecting material may be poly silicon material and oxide material, either of which is capable of reflecting incoming radiation. The security structure can also include a top layer of reflecting material and, in embodiments, a bottom layer of reflecting material, to form a security box around the optical component. The optical component may be front end of the line (FEOL) silicon components or a back end of the line (BEOL) silicon nitride components, amongst other optical components.

In further embodiments, the security structure may be a Bragg reflector including vertical walls of alternative material with different refractive indices (i.e., polysilicon and oxide). Also, the width of each of the vertical walls can be chosen for a predetermined light wavelength. Further, a height of the Bragg reflector may be greater than a height of the waveguide. For example, the height of the Bragg reflector consisting of the vertical walls can be approximately 4.5 to 5 times taller than the height of the waveguide.

The photonic chip security structure can be manufactured in a number of ways using a number of different tools. In general, though, the methodologies and tools are used to form structures with dimensions in the micrometer and nanometer scale. The methodologies, i.e., technologies, employed to manufacture the photonic chip security structure of the present disclosure have been adopted from integrated circuit (IC) technology. For example, the structures are built on wafers and are realized in films of material patterned by photolithographic processes on the top of a wafer. In particular, the fabrication of the photonic chip security structure uses three basic building blocks: (i) deposition of thin films of material on a substrate, (ii) applying a patterned mask on top of the films by photolithographic imaging, and (iii) etching the films selectively to the mask.

FIG. 1 shows an optical component, amongst other features, and respective fabrication processes in accordance with aspects of the present disclosure. More specifically, the structure 10 includes a substrate 12 and dielectric stack of materials 14 with one or more electronic components 16 and an optical component 18. In embodiments, the electronic components 16 may be any passive or active device including, e.g., transistors with contacts and metal wiring layers, etc. The optical component 18 may be any optical component such as, e.g., a waveguide or other photonic devices amongst many different examples.

The substrate 12 is preferably a semiconductor-on-insulator (SOI) substrate. For example, the substrate 12 includes a semiconductor handle substrate 12a, an insulator layer 12b and a semiconductor layer 12c. In embodiments, the semiconductor handle substrate 12a and semiconductor layer 12c may be composed of any suitable material including, but not limited to, Si, SiGe, SiGeC, SiC, GaAs, InAs, InP, and other III/V or II/VI compound semiconductors. The semiconductor layer 12c may also include any suitable crystallographic orientation (e.g., a (100), (110), (111), or (001) crystallographic orientation). The insulator layer 12b may include a dielectric material such as silicon dioxide, silicon nitride, silicon oxynitride, boron nitride or a combination thereof and, preferably, a buried oxide layer (BOX) supported on the semiconductor handle substrate 12a.

Still referring to FIG. 1, the dielectric stack of materials 14 may include alternating layers of dielectric material 14a, 14b. For example, the dielectric stack of materials 14 may include alternating layers of oxide material 14a and nitride material 14b. In more specific embodiments, the oxide material 14a may include $SiO_2$ and the nitride material 14b may include SiN. The alternating layers of dielectric material 14a, 14b may be deposited by conventional deposition methods such as, e.g., chemical vapor deposition (CVD).

Figure 2:
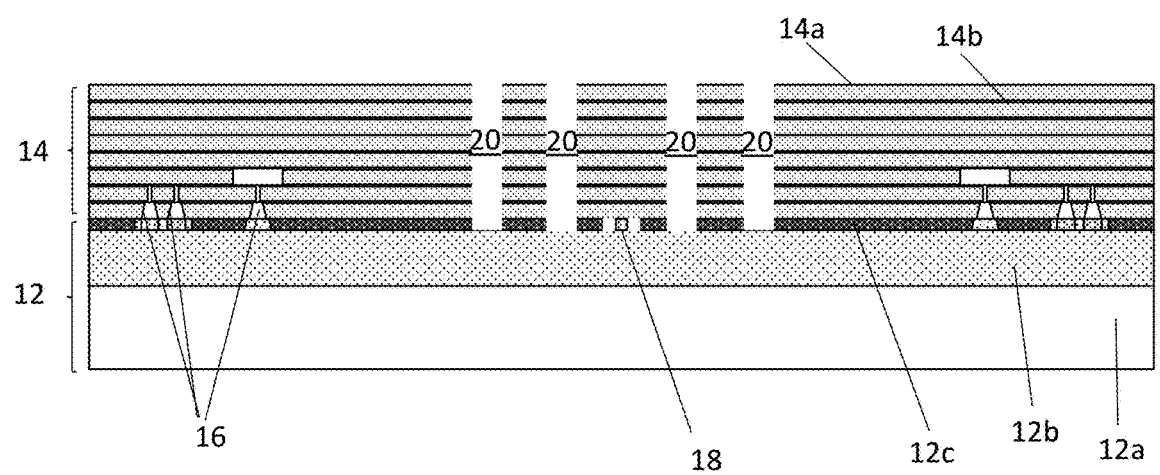
FIG. 2 shows trenches formed through a dielectric stack and surrounding the optical component, amongst other features, and respective fabrication processes in accordance with aspects of the present disclosure.

In FIG. 2, trenches 20 are formed through the dielectric stack of materials 14. In more specific embodiments, the trenches 20 are formed on sides of the optical component 18. In this layout scheme, the optical component 18 may be a front end of the line Si optical component; although, it is also contemplated that the optical component 18 may be a back end of the line SiN optical component within the dielectric stack of materials 14.

The trenches 20 may be formed by conventional lithography and etching methods known to those of skill in the art. For example, a resist formed over the dielectric stack of materials 14 is exposed to energy (light) to form a pattern (opening). An etching process with a selective chemistry, e.g., reactive ion etching (RIE), will be used to transfer the pattern from the resist layer to the dielectric stack of materials 14 to form one or more trenches 20 in the dielectric stack of materials 14. In embodiments, the trenches 20 will extend to the buried insulator layer 12b; however, it is also contemplated that the trenches 20 can extend into the insulator layer 12b. Although FIG. 2 shows four trenches 20 being formed, any number of trenches can be formed for a Bragg reflector.

Figure 3:
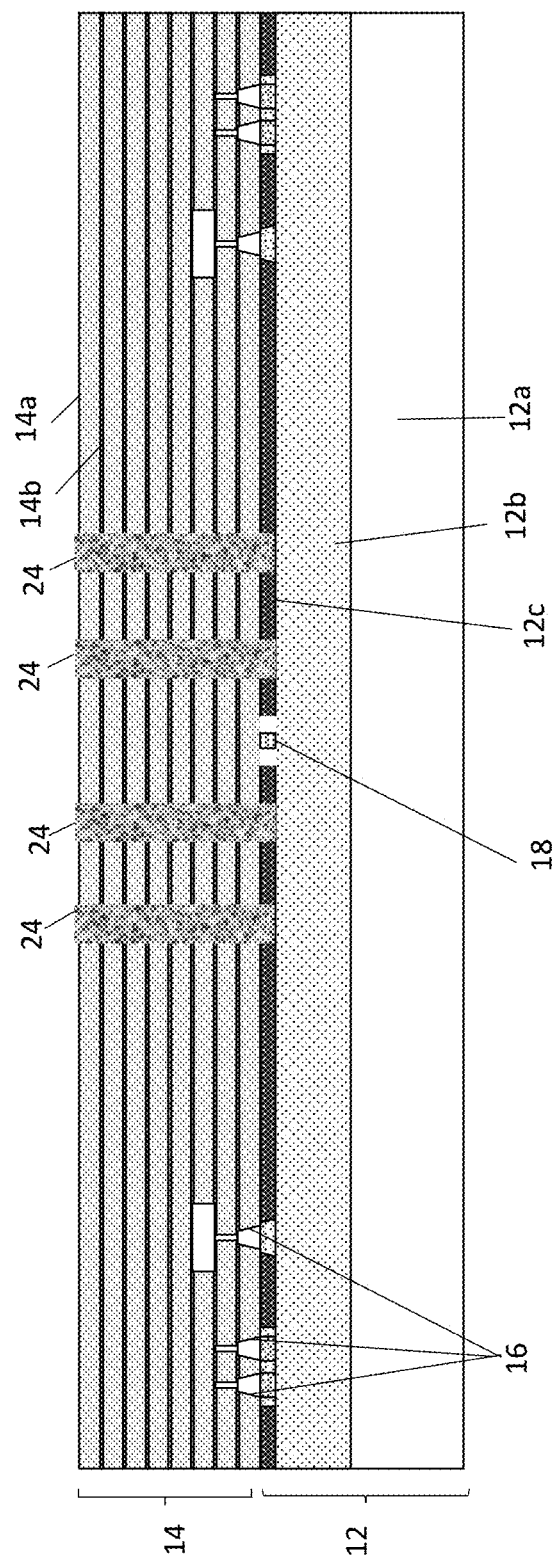
FIG. 3 shows the trenches filled with reflecting material, amongst other features, and respective fabrication processes in accordance with aspects of the present disclosure.

As shown in FIG. 3, reflecting material 24 (i.e., a Bragg reflector) may be formed within the trenches 20 to form the photonic chip security structure. In this way, the photonic chip security structure includes a vertical wall of the reflecting material 24 which surrounds the optical component 18, e.g., photonic waveguides or functional optical devices.

Further, the vertical wall of the reflecting material 24 may extend into the insulator layer 12b. In embodiments, the vertical wall of the reflecting material 24 may be polysilicon material and oxide material, as examples. In embodiments, the polysilicon can be doped material, and may be used for shorter wavelengths of incoming radiation. In any scenario, though, the polysilicon material and oxide material provide reflecting properties of the incoming radiation without affecting the optical performance of the optical component 18. The reflecting material 24 may be deposited using, for example, CVD processes. Any residual material on the surface of the dielectric stack 14 may be removed by conventional chemical mechanical polishing (CMP) processes.

Figure 4:
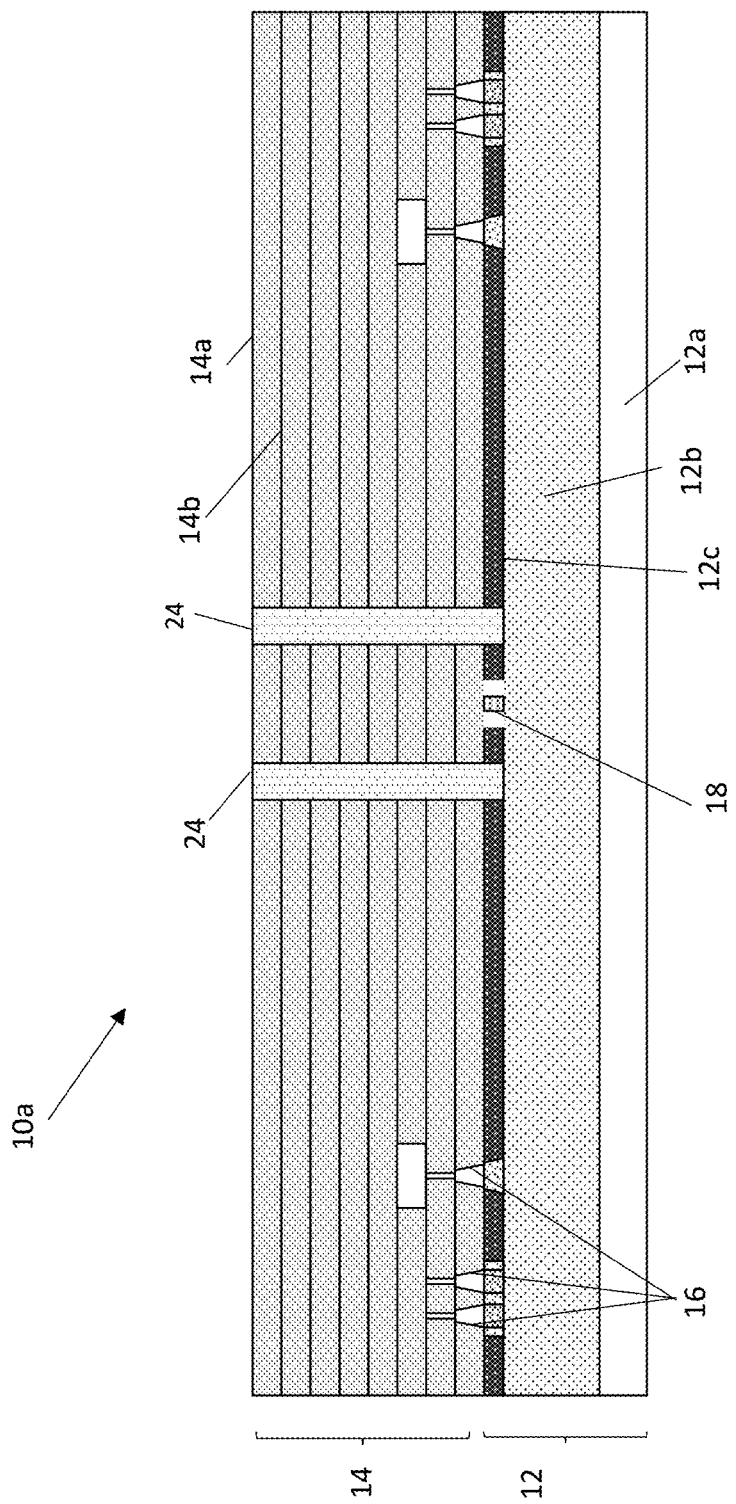
FIGS. 4-17 show various alternate embodiments security structures including reflecting material, amongst other features, and respective fabrication processes in accordance with additional aspects of the present disclosure.

FIG. 4 shows an embodiment of a photonic chip security structure 10a in which a single vertical wall 24 is provided on each side of the optical component 18. In this embodiment, the vertical wall of the reflecting material 24 may be polysilicon material. In alternative embodiments, the vertical wall of the reflecting material 24 may be a different material than polysilicon, i.e., oxide material.

Figure 5:
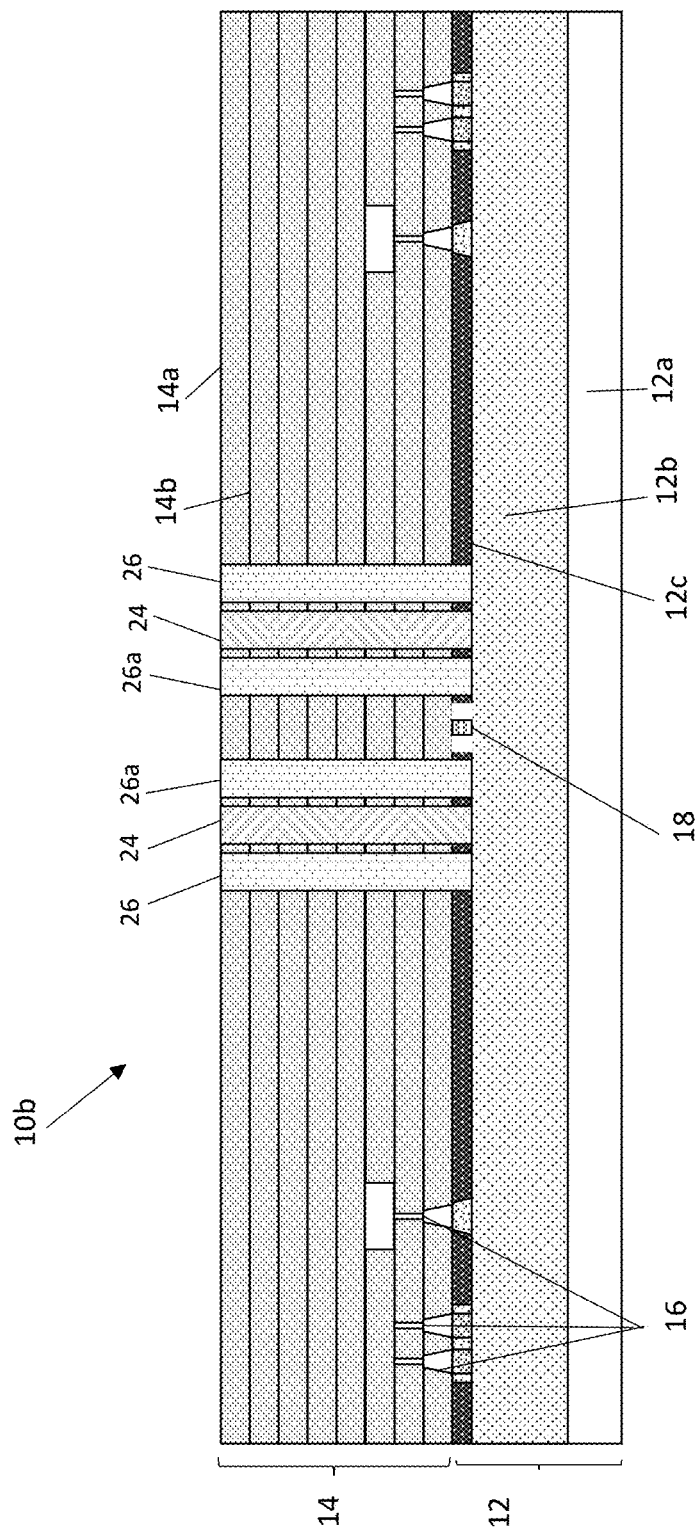

FIG. 5 shows another embodiment of a photonic chip security structure 10b in which three vertical walls 26, 24, 26a are provided on each side of the optical component 18. In this embodiment, a vertical wall of reflecting material 24 (i.e., a Bragg reflector) may be provided between two vertical walls 26, 26a including dielectric materials on each side of the optical component 18. In particular, the vertical walls 26, 26a including dielectric materials may be oxide; whereas the reflecting material 24 may be polysilicon. Other combinations of reflective material and dielectric material are also contemplated herein. The remaining features are similar to that described in FIG. 4.

Figure 6:
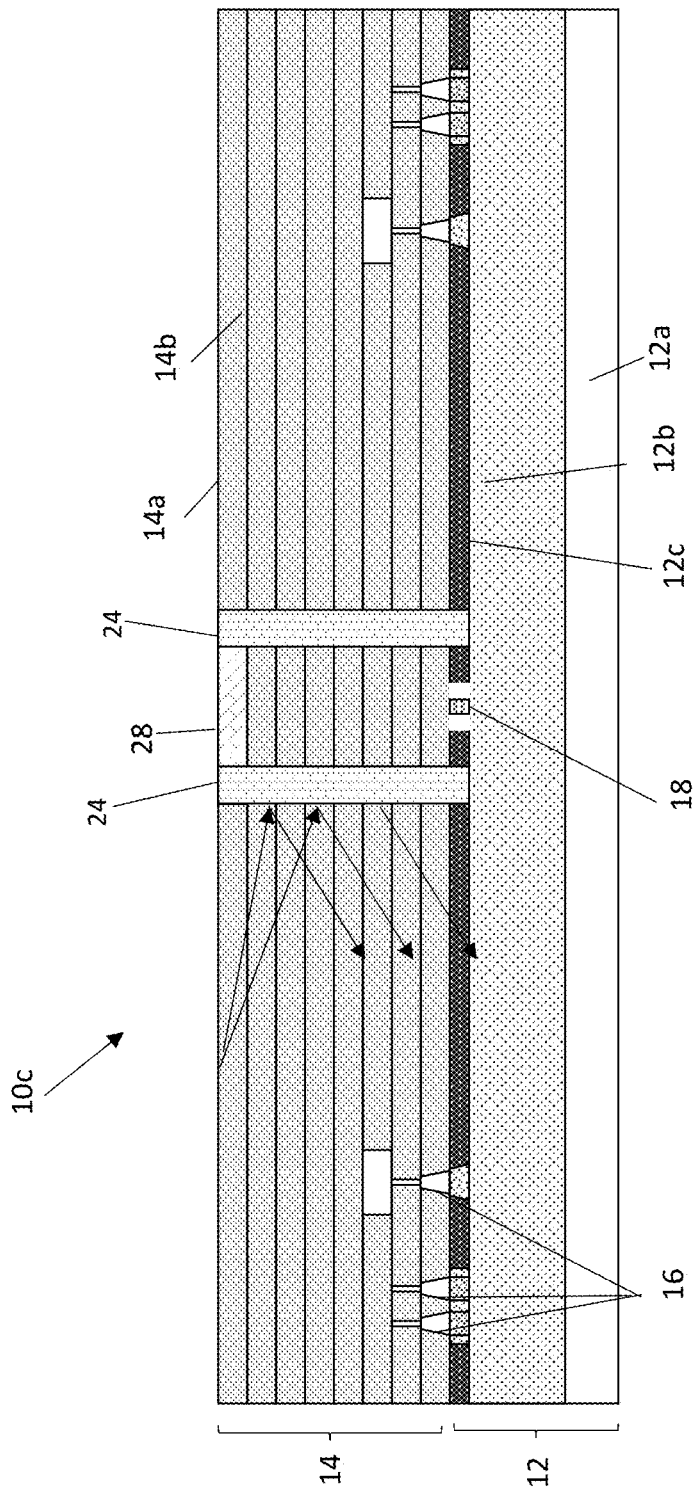

FIG. 6 shows an embodiment of the photonic chip security structure 10c in which a lateral wall 28 of reflecting material (i.e., a lateral Bragg reflector) is connected to the vertical walls 24 of the reflecting material (i.e., a vertical Bragg reflector). In this way, an enclosure is formed around (e.g., surrounding) the optical component 18 from sides and a top. In embodiments, the reflecting material for the vertical wall 24 and top wall 28 may be the same material or different material. For example, the reflecting material of the lateral wall 28 may include a lateral stack of polysilicon/oxide. Further, the reflecting material of the lateral wall 28 may be multiple stacks of polysilicon/oxide. The remaining features are similar to that described in FIG. 4.

Figure 7:
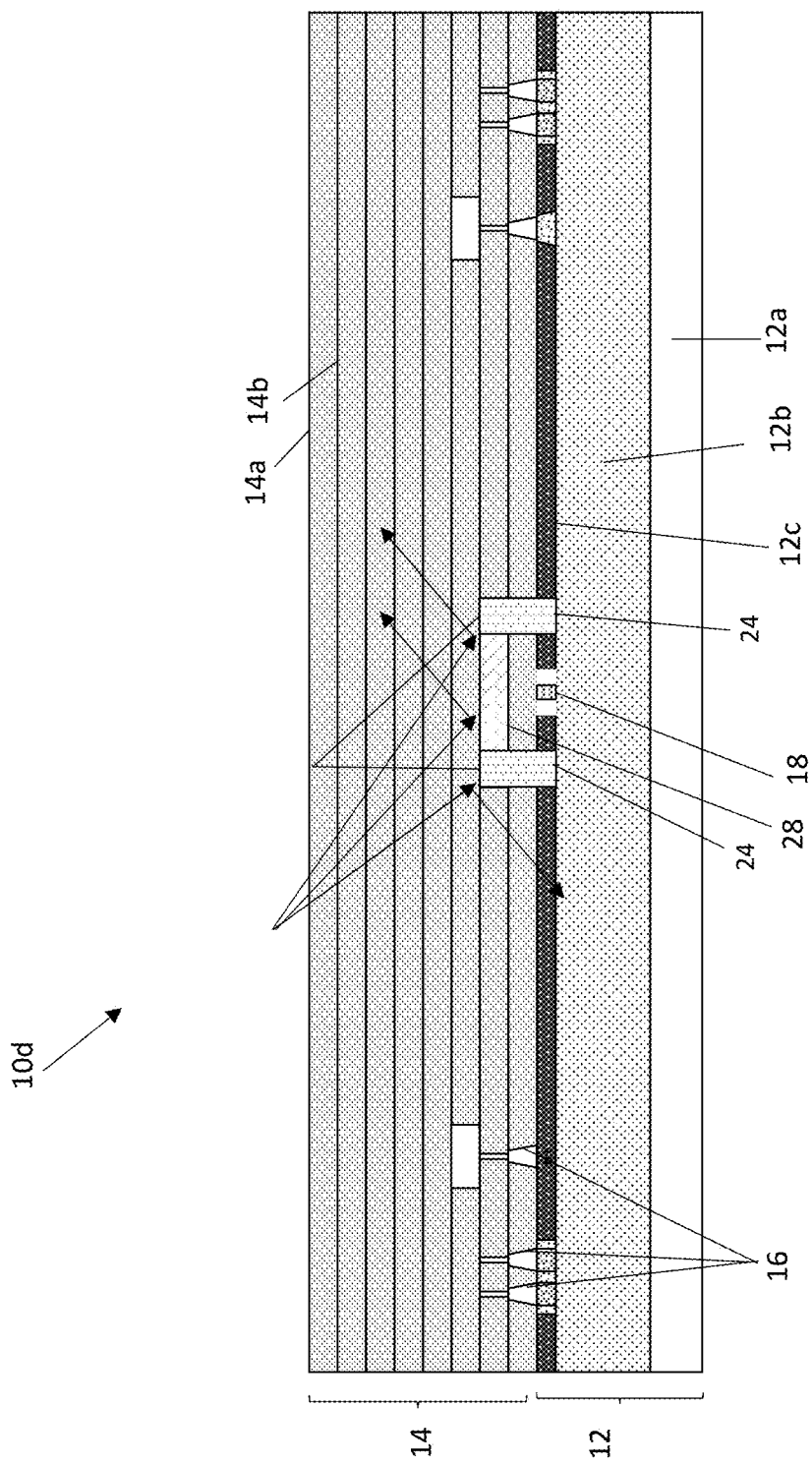

FIG. 7 shows another embodiment of the photonic chip security structure 10d in which the lateral wall 28 of reflecting material (i.e., a lateral Bragg reflector) is connected to the vertical wall 24 (i.e., a vertical Bragg reflector) within the dielectric stack of materials 14. In comparison to FIG. 6, for example, a height of the vertical wall 24 (i.e., a vertical Bragg reflector) is lower than a top surface of the dielectric stack of materials 14. The remaining features are similar to that described in FIG. 6.

Figure 8:
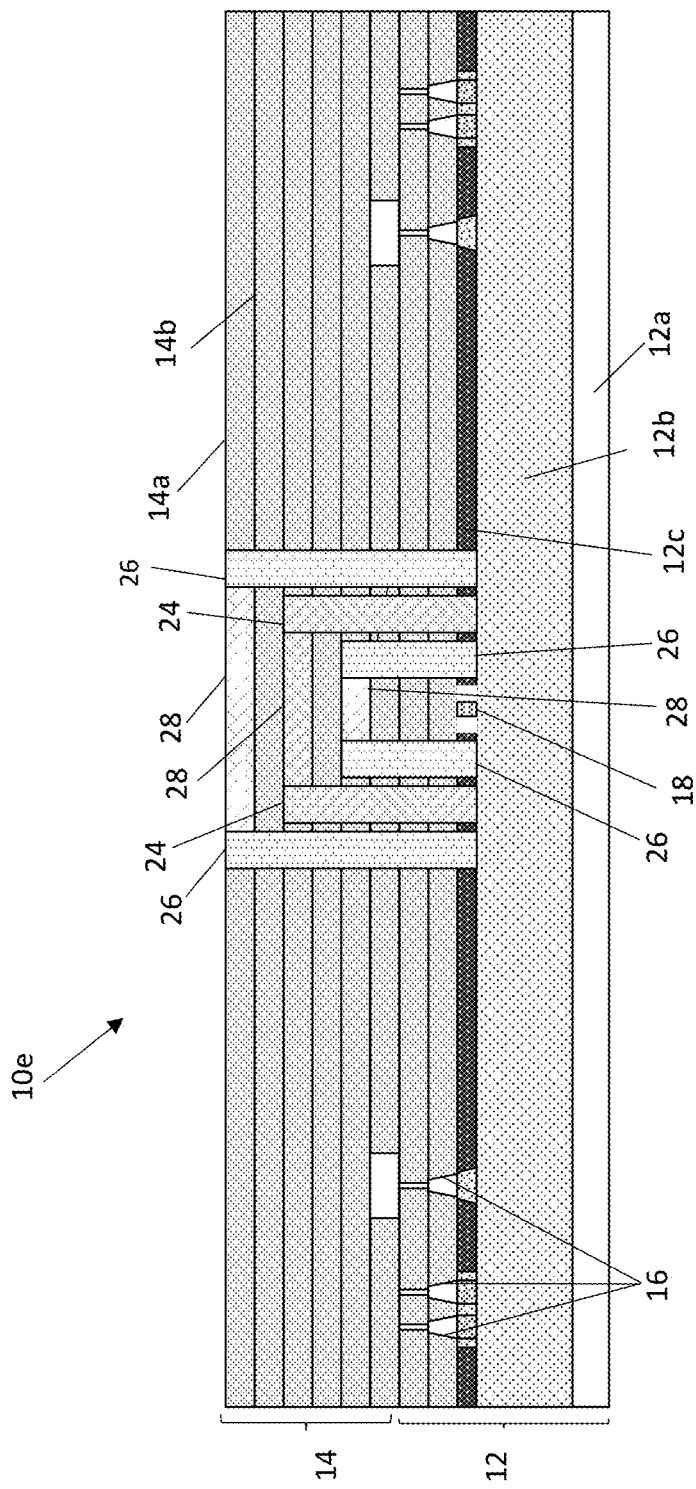

FIG. 8 shows an embodiment of the photonic chip security structure 10e in which multiple lateral walls 28 of reflecting material (i.e., a lateral Bragg reflector) are connected to multiple vertical walls of the dielectric materials 26 and the vertical wall 24 of the reflecting material (i.e., a vertical Bragg reflector). The photonic chip security structure 10e includes multiple walls may be constructed using deep trench etching and deposition processing techniques known to those of skill in the arts. As a result, in the photonic chip security structure 10e, the multiple walls result in an enhanced Bragg reflection protection effect. The remaining features are similar to that described in FIG. 4.

Figure 9:
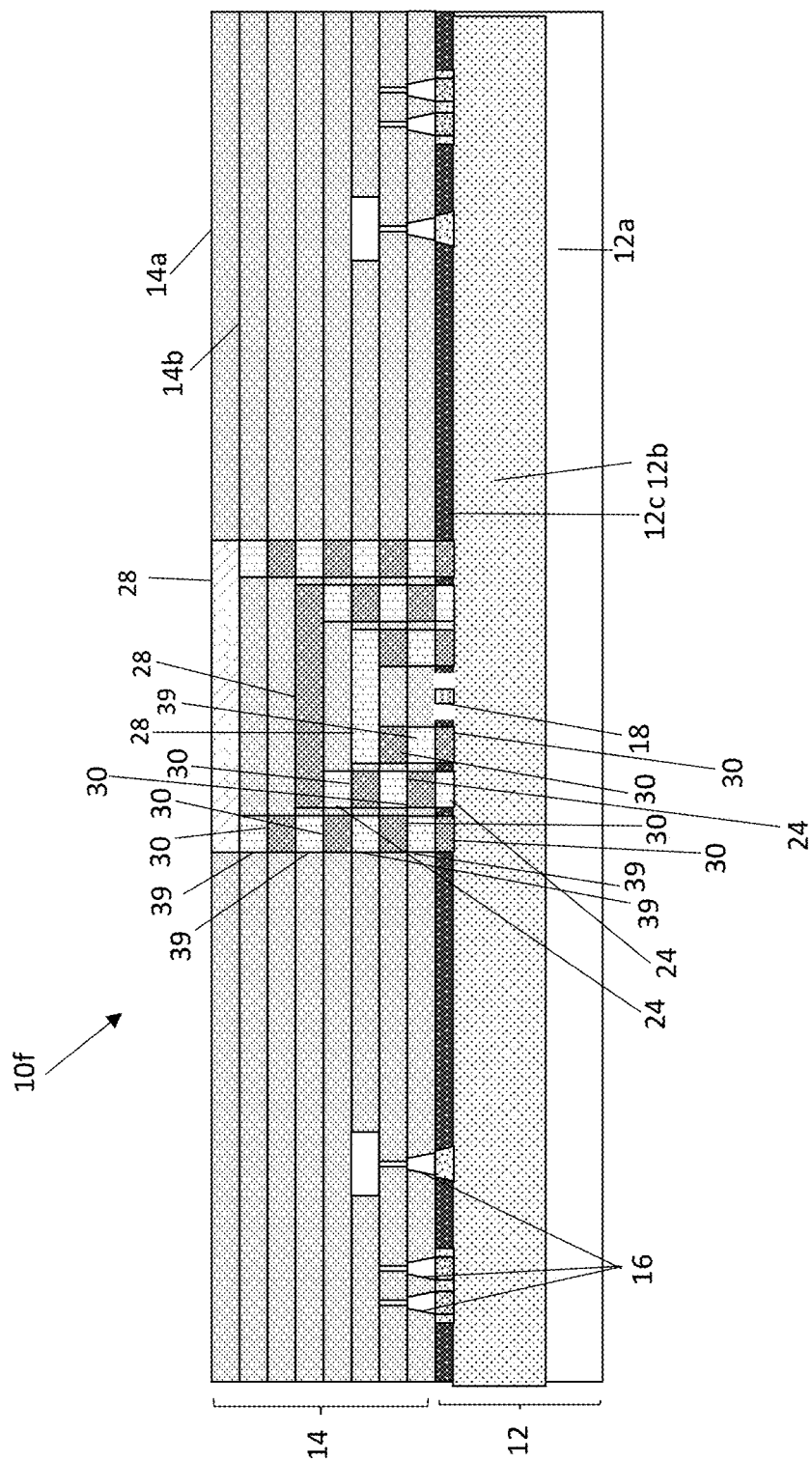

FIG. 9 shows another embodiment of the photonic chip security structure 10f in which different materials, e.g., dielectric material 39 alternating with dielectric material 30, are provided for the vertical walls. Further, the lateral reflecting material 28 (i.e., a lateral Bragg reflector) are connected to the vertical walls which include the dielectric material 39 alternating with the dielectric material 30. In this embodiment, the dielectric materials may be different dielectric materials to enhance a Bragg reflection. The photonic chip security structure 10f may be fabricated using a level by level processing integration schemes, e.g., etching and deposition processes, as should be understood by those of skill in the art. The remaining features are similar to that described in FIG. 8.

Figure 10:
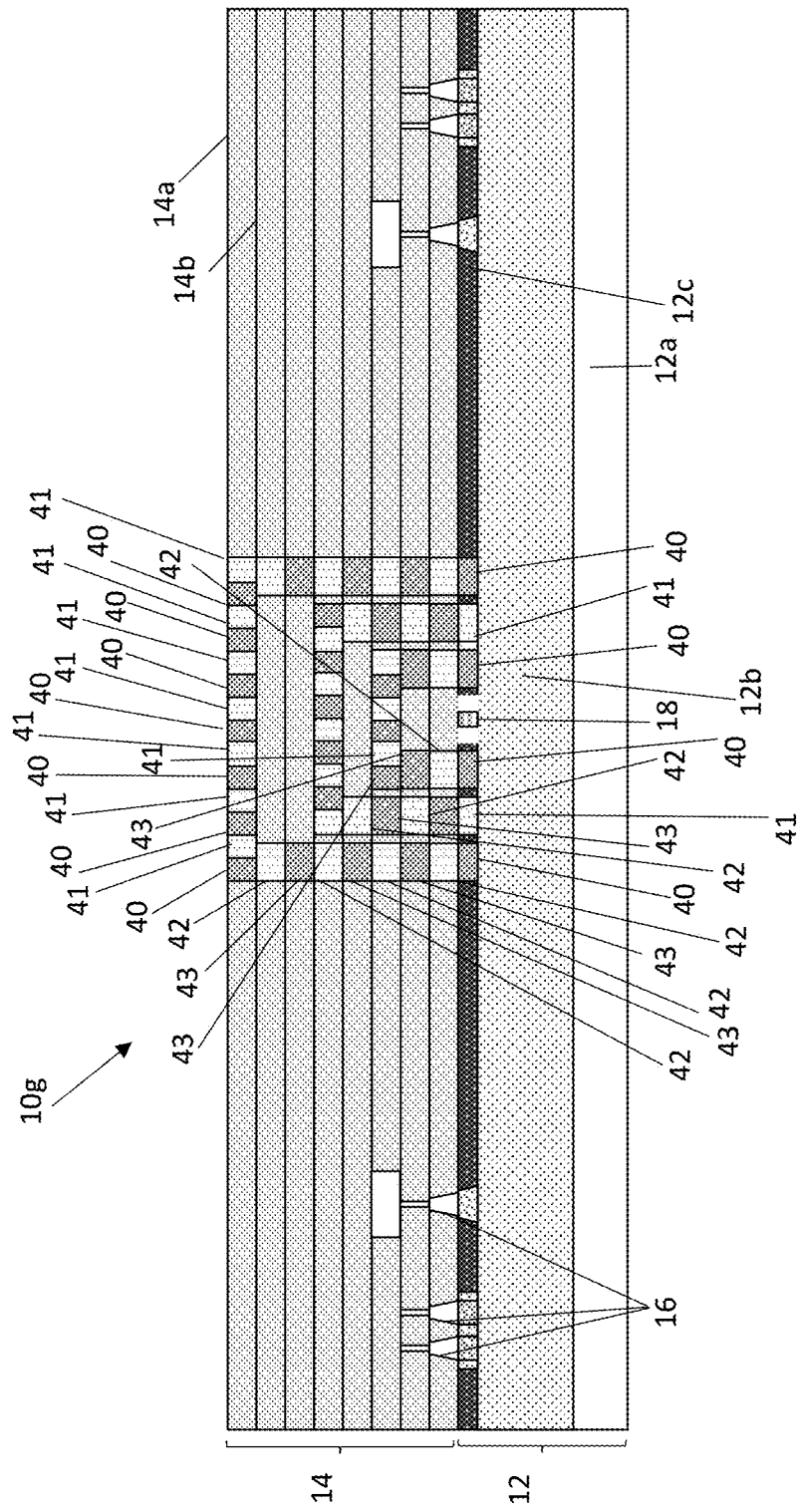

FIG. 10 shows an embodiment of the photonic chip security structure 10g in which the lateral walls 28 include dielectric material 40 alternating with dielectric material 41, and vertical walls 24 include dielectric material 42 alternating with dielectric material 43. Again, the dielectric materials can be different material to enhance the Bragg reflection. The remaining features are similar to that described in FIG. 8.

Figure 11:
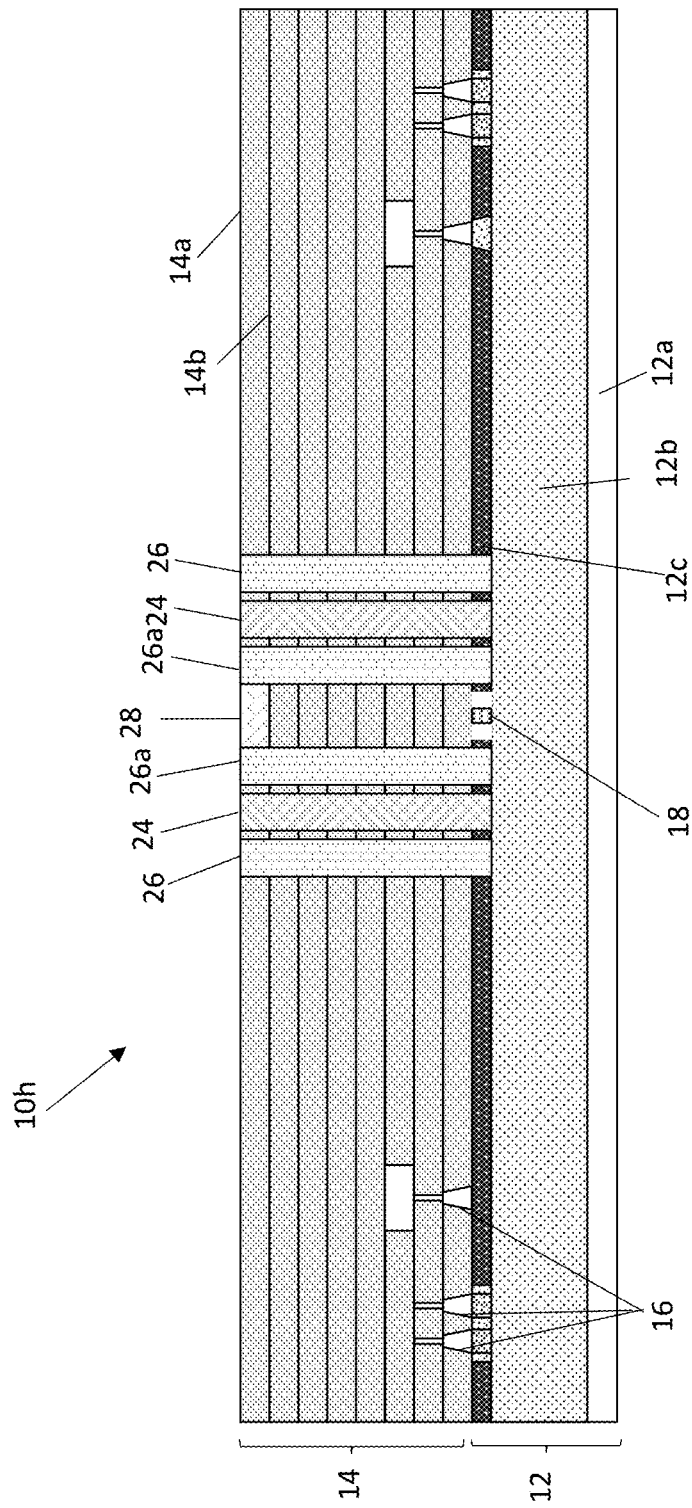

FIG. 11 shows an embodiment of the photonic chip security structure 10h in which a vertical wall 24 of reflecting material (i.e., the Bragg reflector) is between vertical walls 26, 26a composed of dielectric material, on each side of the optical component 18. In addition, a lateral wall 28 including reflecting material (i.e., the lateral Bragg reflector) may be connected to an inner of the vertical walls 26a. In this way, an enclosure is formed around (e.g., surrounding) the optical component 18 from sides and a top. The dielectric material 26 can be an oxide; whereas the reflecting material 24 may be polysilicon.

In embodiments, the lateral wall 28 of reflecting material may be the same material as the dielectric material 26. In alternative embodiments, the lateral wall 28 of reflecting material may be a different material than the vertical walls 26, 26a. For example, the lateral wall 28 of reflecting material may include a lateral stack of polysilicon/oxide. Further, the lateral wall 28 of reflecting material 28 may be multiple stacks of polysilicon/oxide. The remaining features are similar to that described in FIG. 4.

Figure 12:
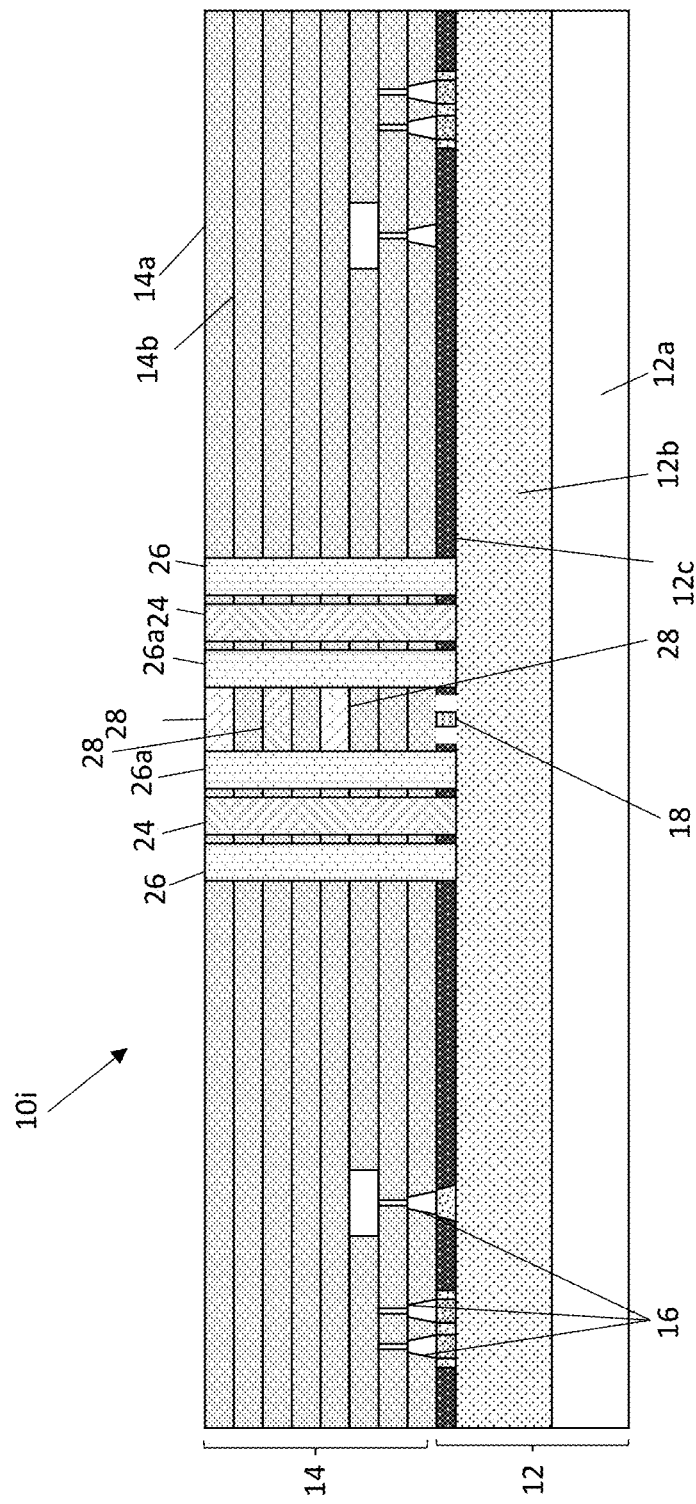

FIG. 12 shows an embodiment of the photonic chip security structure 10i in which multiple lateral walls 28 of reflecting material are connected to a single, inner vertical wall 26a of the reflecting material (i.e., the Bragg reflector). The vertical wall 24 is also between the vertical walls 26, 26a including dielectric materials on each side of the optical component 18. As a result, the multiple walls of result in an enhanced Bragg reflection protection effect. The remaining features are similar to that described in FIG. 11.

Figure 13:
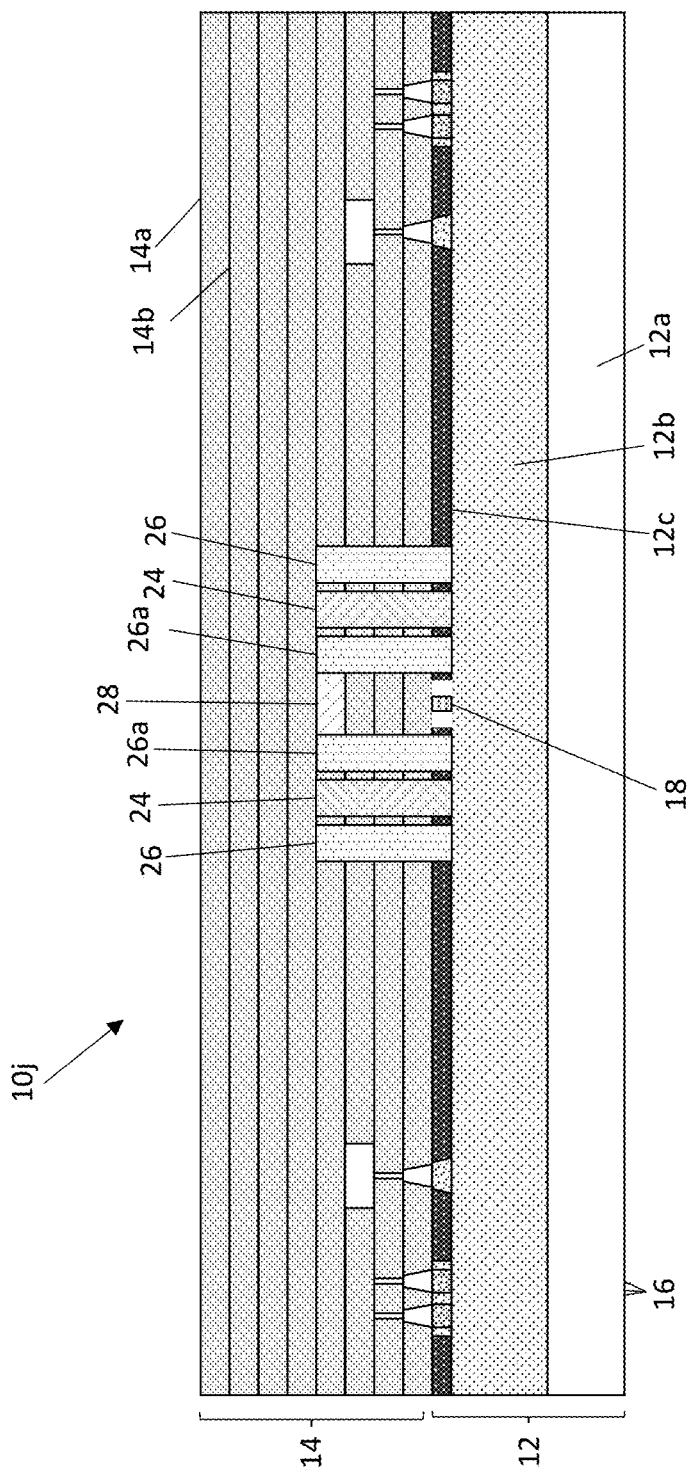

FIG. 13 shows an embodiment of the photonic chip security structure 10j in which three vertical walls 26, 24, 26a are provided on each side of the optical component 18 at a height below that of the stack of dielectric materials 14. In this embodiment, the vertical wall of reflecting material 24 (i.e., the Bragg reflector) may be between vertical walls 26, 26a of dielectric material on each side of the optical component 18. Also, the lateral wall 28 may be connected to the vertical wall 26a of the dielectric material. In comparison to FIG. 11, a height of the reflecting material 24 (i.e., the vertical Bragg reflector) may be lower than a top surface of the dielectric stack of materials 14. The remaining features are similar to that described in FIG. 11.

Figure 14:
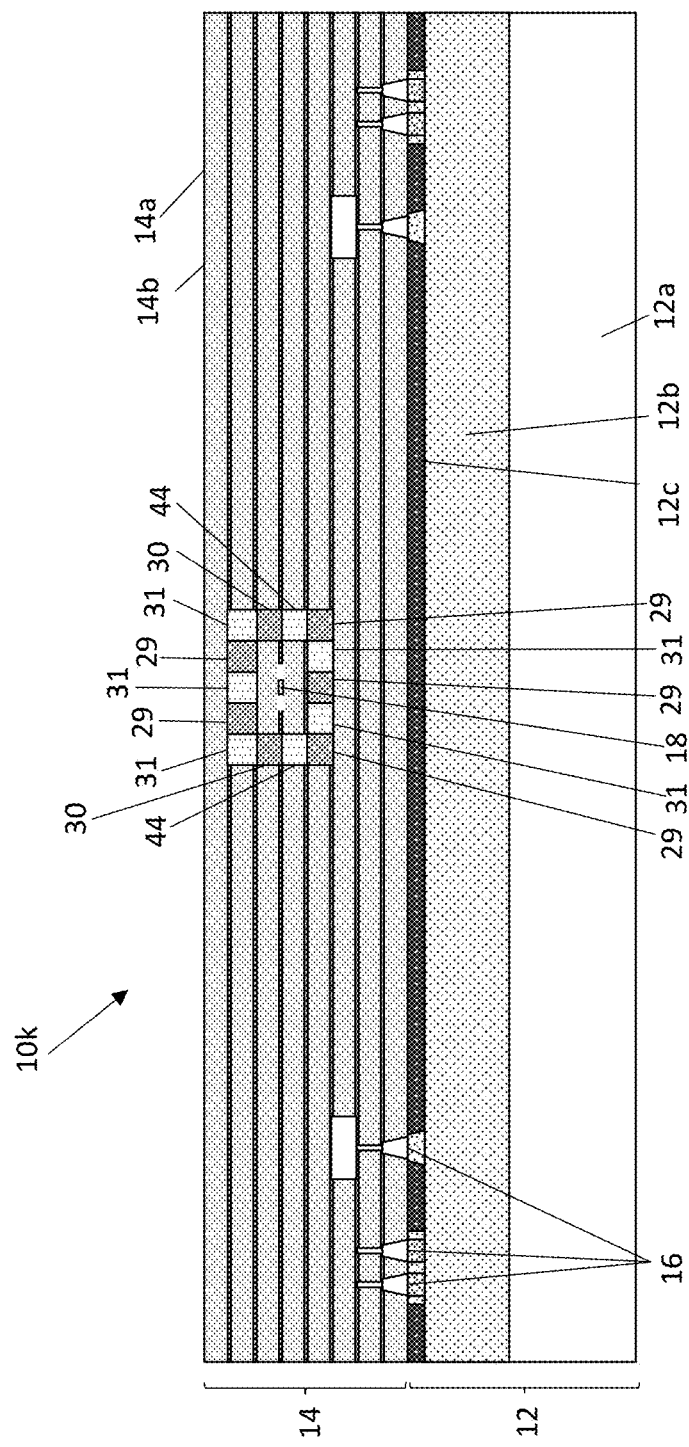

FIG. 14 shows an embodiment of the photonic chip security structure 10k in which a back end of the line (BEOL) optical component 18 (e.g., silicon nitride waveguide) may be formed within the dielectric stack of materials 14. In this embodiment, the optical component 18 may be completely surrounded by reflecting material 29 alternating with reflecting material 31 in a lateral orientation, e.g., lateral wall, and dielectric material 44 alternating with dielectric material 30 in a vertical orientation, e.g., vertical wall. As in the previous embodiments, the dielectric materials 26, 30 and the reflecting materials 29, 31 may be fabricated using conventional lithography, etching and deposition methods as described herein. Further, the reflecting material 29 may be the same material or different material as the reflecting material 31, and the dielectric material 26 may be the same material or different material as the dielectric material 30. The remaining features are similar to that described in FIG. 4.

Figure 15:
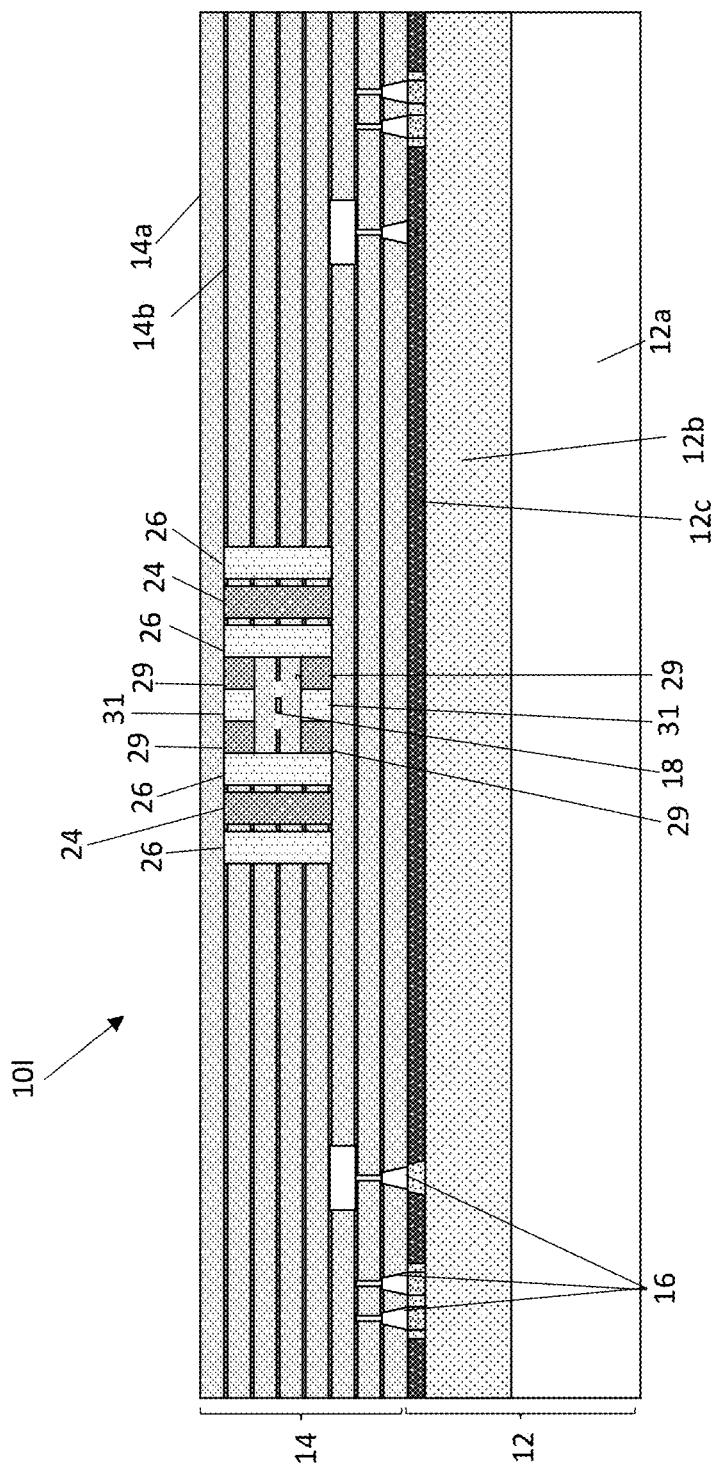

FIG. 15 shows an embodiment of the photonic chip security structure 10l in which the optical component is a back end of the line (BEOL) optical component 18 (e.g., silicon nitride waveguide) within the dielectric stack of materials 14 and which is completely surrounded by vertical and lateral walls including reflecting material 29 alternating with reflecting material 31. In this embodiment, the vertical wall 24 of the reflecting material (i.e., a Bragg reflector) may be between two vertical walls 26, 26a of reflecting materials on each side of the optical component 18. The reflecting material 29, may be the same material or different material as the reflecting material 31, and the dielectric material in the vertical walls 26, 26a may be the same material or different material as the vertical wall of reflecting material 24, all of which are above the substrate 12. The remaining features are similar to that described in FIG. 14.

Figure 16:
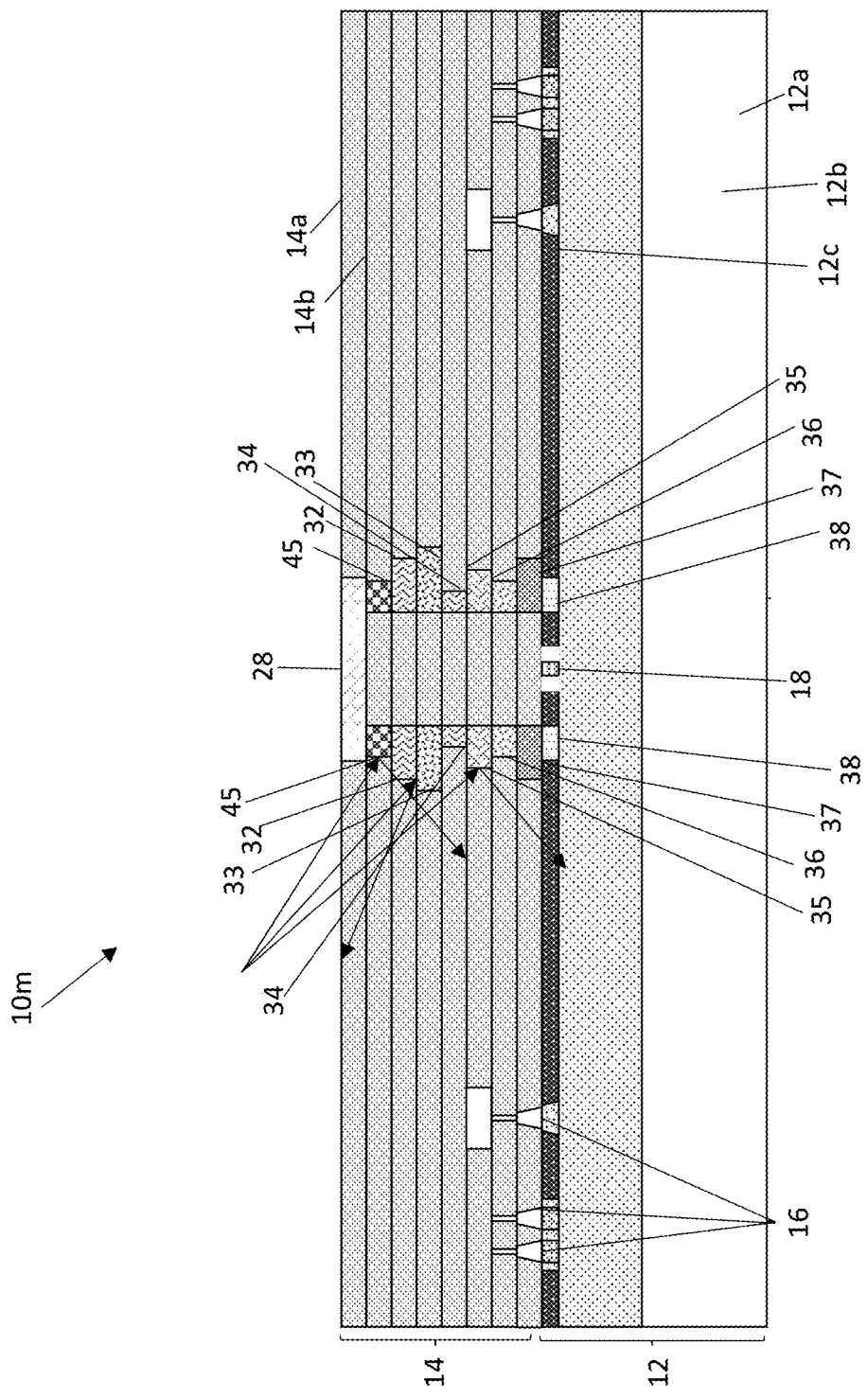

FIG. 16 shows an embodiment of the photonic chip security structure 10m in which the vertical walls 24 may include alternating reflective materials 45, 32, 33, 34, 35, 36, 37, and 38 of different lengths in the lateral direction. Also, the lateral reflecting material 28 (i.e., a lateral Bragg reflector) is connected to vertical walls. In embodiments, the reflecting material 28 may be the same material as the reflecting materials 45, 32, 33, 34, 35, 36, 37, and 38. In alternative embodiments, the lateral reflecting material 28 may be a different material than the reflecting materials 45, 32, 33, 34, 35, 36, 37, and 38. For example, the lateral wall 28 of reflecting material may include a lateral stack of polysilicon/oxide. Further, the reflecting material of the lateral wall 28 may be multiple stacks of polysilicon/oxide. Also, the reflecting materials 45, 32, 33, 34, 35, 36, 37, and 38 may be of a multi-layer stack of alternatively high index and low index films. The remaining features are similar to that described in FIG. 6.

Figure 17:
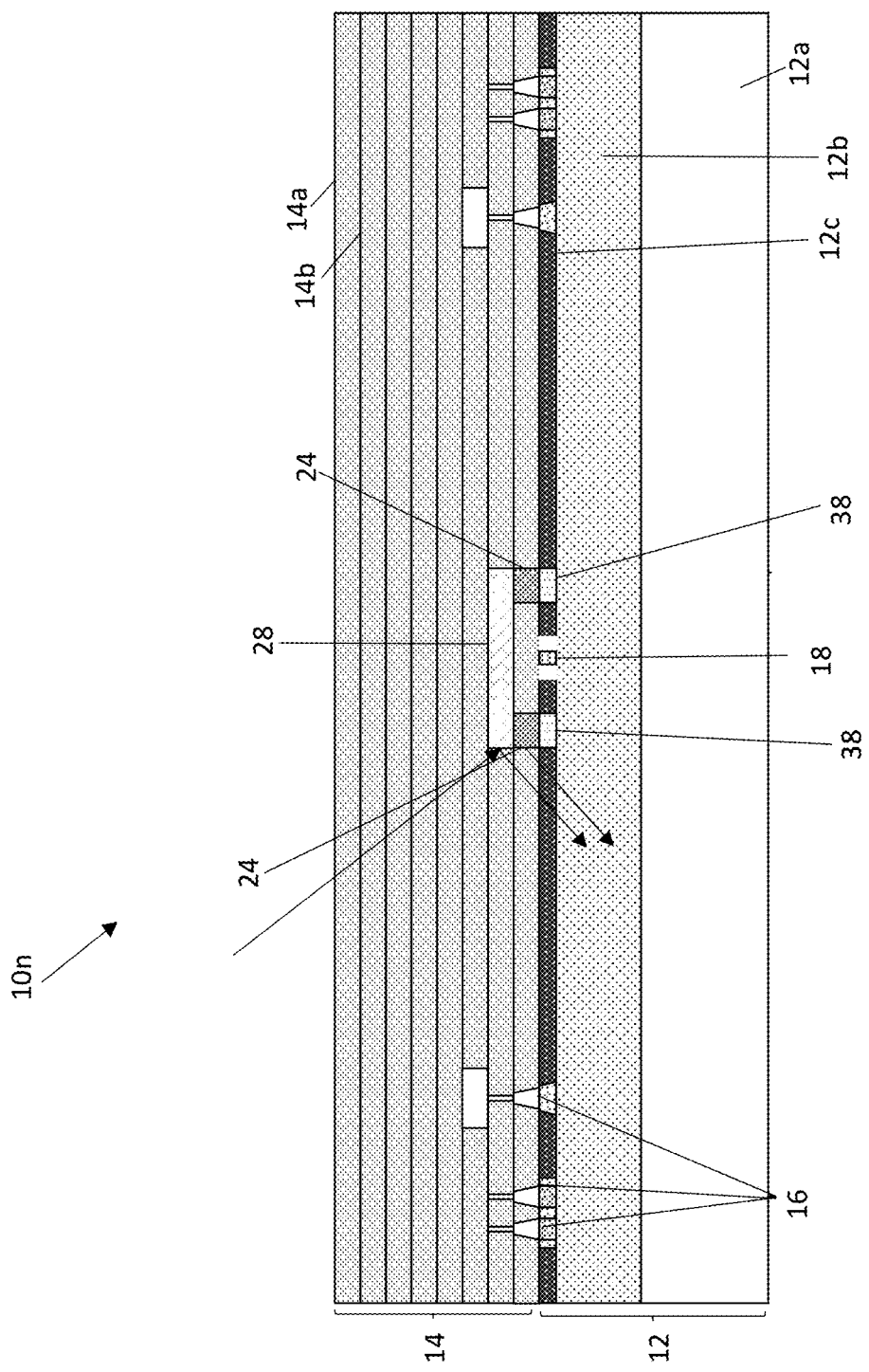

FIG. 17 shows an embodiment of the photonic chip security structure 10n in which lateral wall 28 of reflecting material (i.e., a lateral Bragg reflector) may be connected to the vertical walls 24 including reflecting material (i.e., a vertical Bragg reflector). In comparison to FIG. 16, a height of the vertical walls 24 is lower than a top surface of the dielectric stack 14, with the vertical walls making contact to the substrate 12. The remaining features are similar to that described in FIG. 7.

Figure 18:
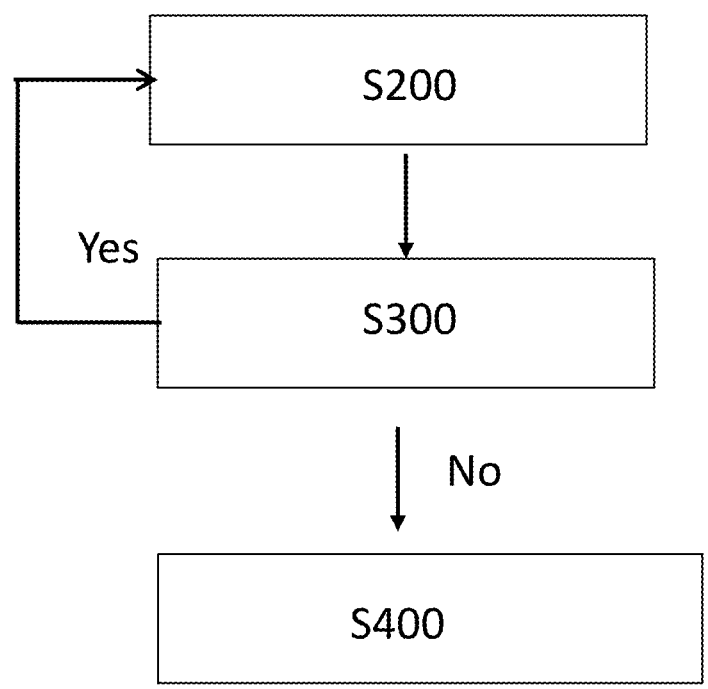
FIG. 18 shows a flowchart depicting a method of detecting a security breach using the photonic chip security structure in accordance with aspects of the present disclosure.

FIG. 18 shows a flowchart depicting the method of detecting a security breach. In particular, polysilicon layers which form a Bragg reflector may be doped and electrically connected to a detector circuit for monitoring a resistance change of the Bragg reflector. For example, any attempt to breach the Bragg reflector can be detected by a change in resistance, with the circuit operation of photonic chip security being terminated upon such detection. More specifically, in step S200, a resistance of a Bragg reflector layer can be detected. In step 300, a detected resistance can be compared with a predetermined acceptable limit. If the detected resistance is within the predetermined acceptable limit (i.e., YES to step 300), the method returns to step S200. However, if the detected resistance is not within the predetermined acceptable limit (i.e., NO to step 300), the method continues to step S400. In step S400, a tamper signal is generated, and the optical signal can be terminated.

In another embodiment of FIGS. 17 and 18, a security detect tampering switch may include a capacitance measurement sensor (e.g., a PIN diode or photonic detector) which is positioned adjacent to the reflecting material (e.g., lateral wall 28 and/or vertical wall 24 of FIG. 17). The capacitance measurement sensor may be calibrated to detect reflections off the reflecting material (e.g., lateral wall 28 and/or vertical wall 24 of FIG. 17). For example, if the reflecting material is tampered, altered, or damaged, the reflections off the reflecting material would also be impacted. Thus, the capacitance measurement sensor would sense that a different reflection or magnitude is reflecting off the reflecting material. Further, when the reflecting material has been physically hacked, a kill switch may be triggered to turn off or destroy the circuitry.

The photonic chip security structures described herein can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both, i.e., surface interconnections and/or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   an optical component on a semiconductor material; and
   at least one vertical wall comprising a reflecting material, the at least one vertical wall extending vertically within a dielectric stack of material and on sides of the optical component, wherein a top surface of the at least one vertical wall is at or below a top surface of the dielectric stack of material, and the dielectric stack of material comprises alternating layers of dielectric materials.

2. The structure of claim 1, wherein another wall of the at least one vertical wall further comprises at least one dielectric material.

3. The structure of claim 1, wherein the at least one vertical wall comprises multiple vertical walls.

4. The structure of claim 3, wherein the at least one vertical wall extends into an insulator material under the semiconductor material.

5. The structure of claim 3, further comprising multiple lateral walls connected to the multiple vertical walls.

6. The structure of claim 3, further comprising multiple lateral walls connected to an inner wall of the multiple vertical walls.

7. The structure of claim 3, further comprising a single lateral wall connecting to an inner wall of the multiple vertical walls.

8. The structure of claim 1, wherein the alternating dielectric materials comprise of a first material that includes an oxide material and a second material that includes a nitride material.

9. The structure of claim 1, wherein the at least one vertical wall comprises multiple stacked materials.

10. The structure of claim 9, wherein the multiple stacked materials of the at least one vertical wall comprise alternating layers of different materials.

11. The structure of claim 1, further comprising a bottom wall connecting to the at least one vertical wall and under the optical component.

12. The structure of claim 1, wherein the reflecting material comprises polysilicon and oxide material.

13. The structure of claim 1, further comprising two walls of dielectric material, wherein the at least one vertical wall is between the two walls of dielectric material.

14. The structure of claim 1, wherein the at least one vertical wall comprises alternating reflecting materials.

15. A structure comprising:
    a silicon-on-insulator (SOI) substrate which includes a semiconductor layer on an insulator layer on a handle substrate;
    an optical component ever within the semiconductor layer and on the insulator layer;
    a dielectric stack of materials covering the optical component; and
    a vertical wall extending vertically within the dielectric stack of materials and on sides of the optical component, wherein a top surface of the at least one vertical wall is at or below a top surface of the dielectric stack of material, and the dielectric stack of material comprises alternating layers of dielectric materials.

16. The structure of claim 15, wherein the vertical wall comprises alternating reflecting materials.

17. The structure of claim 15, wherein the vertical wall comprises at least one dielectric material and extends into the insulator layer.

18. The structure of claim 15, wherein the vertical wall comprises reflecting material, and the reflecting material comprises polysilicon and oxide material.

19. The structure of claim 15, further comprising a top lateral wall which connects to the vertical wall and is over the optical component.

20. A method comprising:
    detecting a resistance of a Bragg reflector of a photonic chip security structure of claim 1;
    comparing the detected resistance of the Bragg reflector with a predetermined acceptable limit; and
    generating a tamper signal in response to the detected resistance of the Bragg reflector being outside the predetermined acceptable limit.

* * * * *